(12) United States Patent
Miura et al.

(10) Patent No.: US 7,842,973 B2
(45) Date of Patent: Nov. 30, 2010

(54) SEMICONDUCTOR DEVICE AND MANUFACTURING METHOD OF THE SAME

(75) Inventors: Makoto Miura, Hachioji (JP); Katsuyoshi Washio, Tokorozawa (JP); Hiromi Shimamoto, Iruma (JP)

(73) Assignee: Hitachi, Ltd., Tokyo (JP)

( * ) Notice: Subject to any disclaimer, the term of this patent is extended or adjusted under 35 U.S.C. 154(b) by 1133 days.

(21) Appl. No.: 11/485,287

(22) Filed: Jul. 13, 2006

(65) Prior Publication Data

US 2007/0045664 A1 Mar. 1, 2007

(30) Foreign Application Priority Data

Aug. 30, 2005 (JP) .............................. 2005-248705

(51) Int. Cl.
*H01L 29/737* (2006.01)
*H01L 21/331* (2006.01)

(52) U.S. Cl. ............... 257/197; 257/616; 257/E29.085; 257/E29.189; 257/E21.093; 257/E21.371; 438/312; 438/370; 438/936

(58) Field of Classification Search ................ 257/191, 257/197, E29.193, 616, E29.085, E29.189, 257/E21.093, E21.371; 438/312, 370, 936
See application file for complete search history.

(56) References Cited

U.S. PATENT DOCUMENTS

| 5,352,912 | A | * | 10/1994 | Crabbe et al. ............... 257/198 |
| 5,440,152 | A | * | 8/1995 | Yamazaki .................... 257/197 |
| 5,962,880 | A | | 10/1999 | Oda et al. |
| 6,492,664 | B2 | | 12/2002 | Tanomura |
| 6,600,178 | B1 | | 7/2003 | Washio et al. |
| 6,667,489 | B2 | | 12/2003 | Suzumura et al. |
| 6,750,484 | B2 | | 6/2004 | Lippert et al. |
| 2004/0256613 | A1 | * | 12/2004 | Oda et al. ..................... 257/19 |
| 2006/0043418 | A1 | | 3/2006 | Miura et al. |

FOREIGN PATENT DOCUMENTS

| JP | 07-147287 | 6/1995 |
| JP | 10-079394 | 3/1998 |
| JP | 2001-068480 | 3/2001 |

(Continued)

*Primary Examiner*—Mary Wilczewski
*Assistant Examiner*—Toniae M Thomas
(74) *Attorney, Agent, or Firm*—Antonelli, Terry, Stout & Kraus, LLP.

(57) ABSTRACT

A semiconductor device capable of avoiding generation of a barrier in a conduction band while maintaining high withstanding voltage and enabling high speed transistor operation at high current in a double hetero bipolar transistor, as well as a manufacturing method thereof, wherein a portion of the base and the collector is formed of a material with a forbidden band width narrower than that of a semiconductor substrate, a region where the forbidden band increases stepwise and continuously from the emitter side to the collector side is disposed in the inside of the base and the forbidden band width at the base-collector interface is designed so as to be larger than the minimum forbidden band width in the base, whereby the forbidden band width at the base layer edge on the collector side can be made closer to the forbidden band width of the semiconductor substrate than usual while sufficiently maintaining the hetero effect near the emitter-base thereby capable of decreasing the height of the energy barrier generated upon increase of the collector current and enabling satisfactory transistor operation at high current.

17 Claims, 16 Drawing Sheets

FOREIGN PATENT DOCUMENTS

| | | |
|---|---|---|
| JP | 2001-505717 | 4/2001 |
| JP | 2002-016076 | 1/2002 |
| JP | 2002-359249 | 12/2002 |
| JP | 2003-168689 | 6/2003 |
| JP | 2006-073566 | 3/2006 |

\* cited by examiner

FIG. 4A
| n | p | n |
|---|---|---|
| Si | SiGe | Si |
FIG. 4B
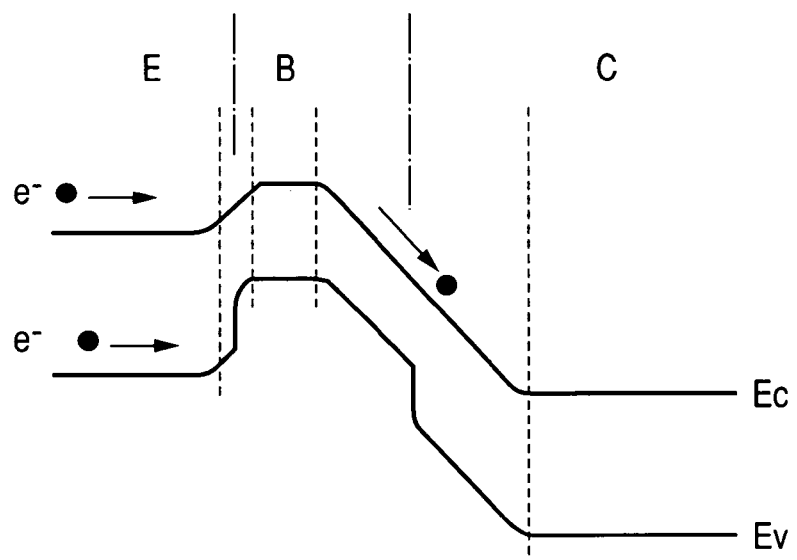
FIG. 4C
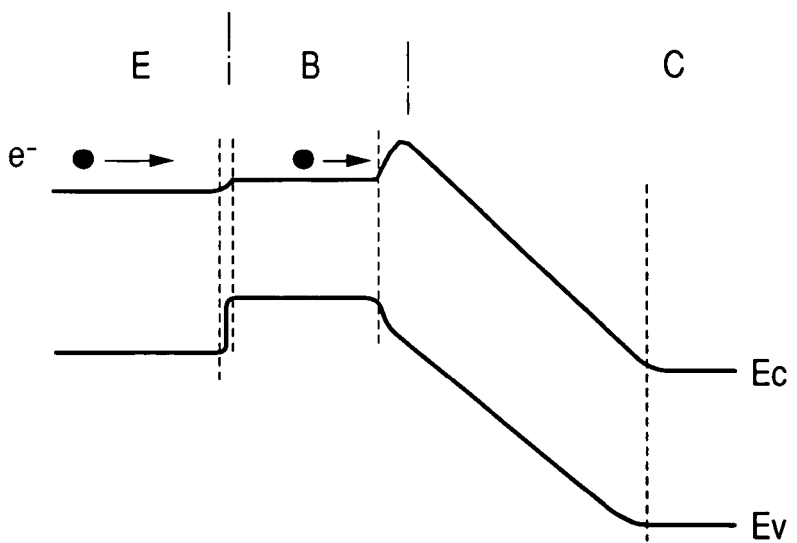

SEMICONDUCTOR DEVICE AND MANUFACTURING METHOD OF THE SAME

CLAIM OF PRIORITY

The present application claims priority from Japanese application JP 2005-248705 filed on Aug. 30, 2005, the content of which are hereby incorporated by reference into this application.

FIELD OF THE INVENTION

The present invention concerns a semiconductor device and a manufacturing method of the same and, more in particular, it relates to a technique suitable to hetero-bipolar transistors.

BACKGROUND OF THE INVENTION

In recent years, bipolar transistors and integrated circuits hybridizing bipolar transistors have been utilized in various application fields. The bipolar transistors have superiority to field effect transistors in view of high speed performance and high voltage withstanding performance and their use has been extended, for example, for devices in communication use or storage systems. As an existent example of a bipolar transistor capable of attaining higher operation speed or higher voltage withstanding, a silicon-germanium hetero bipolar transistor (SiGe HBT) using the selective epitaxial technology as shown in FIGS. 3A and 3B has been known. FIG. 3B shows the distribution of an impurity concentration Nc (cm$^{-3}$) for phosphorous (P), boron (B), and antimony (Sb) as impurities, and FIG. 3A shows the distribution of germanium (Ge) in a main portion of a transistor in existent example 1. Literature concerned with transistors of such structure includes, for example, JP-A No. 10-79394 (1988).

For the sake of easy understanding of a relationship between the distribution of the Ge composition (%) and the impurity concentration Nc, an identical scale is used for the abscissa in common with FIGS. 3A and 3B. In FIG. 3B, are shown an emitter E, a base B and a collector C, as well as boron (B), phosphorus (P), antimony (Sb) in an n-type high concentration buried impurity layer (n$^+$BL), respectively. There are also shown a depletion layer DP, an emitter-base junction $j_{EB}$ and a collector-base junction $j_{BC}$. Also in FIGS. 1, 7, 14, 16, 17, and 19 to be described later, the constitutional portions identical with those in FIG. 3 carry same reference numerals.

The impurity concentration of the low concentration collector layer (n$^-$Si) is controlled depending on the application use of a transistor. That is, increase of the concentration is intended by ion implantation or the like in a transistor intended for high speed operation, and the concentration is kept low for a transistor where an importance is attached to a high voltage withstanding characteristic.

The distribution of germanium is designed so as to cover the base region, and a hetero interface comprising the junction of silicon and silicon-germanium is formed in the emitter-base junction $j_{EB}$. In a hetero bipolar transistor (HBT), change of the forbidden band width at the hetero interface near the emitter-base junction restricts the hole current flowing from the base to the emitter to provide an effect of improving the current gain, etc. On the other hand, on the side of the collector, since the change of the forbidden band width may possibly hinder the operation of a transistor, the hetero interface is designed so as to be at a certain distance from the collector-base junction $j_{BC}$. In a case where the hetero interface is present near the collector-base junction, there is a high possibility that the hetero interface is situated in the p-type base layer under the effect of diffusion of base impurities due to the heat treatment upon preparation of the transistor, etc.

In this case, all discontinuous amounts of the forbidden band width appear as a barrier in the conduction band to greatly hinder the electron conduction and bring about remarkable decrease in the current gain and deterioration for the high speed operation of the transistor. In a case of an npn-bipolar transistor using silicon-germanium, when the hetero interface is present sufficiently from the collector-base junction $j_{BC}$ to the collector side, since all discontinuous amounts of the forbidden band width appear on the side of the valence electron band, the foregoing problem does not occur at least in the low current operation.

FIGS. 7A and 7B are views of a transistor structure showing existent example 2. For avoiding generation of a barrier in a conduction band Ec. It has been known that the height for the energy barrier generating at once is decreased by gradually decreasing the germanium composition on the side of the collector toward the high concentration buried impurity layer (Sb) in a silicon substrate as shown in FIG. 7A. FIG. 7A shows a germanium composition and FIG. 7B shows a distribution of an impurity concentration Nc. Literature concerned with the transistor of structure as in existent example 2 include, for example, JP-A No. 7 (1995)-147287.

Further, as existent example 3, it has been known to increase the working current by inserting a delta doping layer with the impurity concentration being increased in the collector near the base-collector interface. In this case, as shown in FIG. 9, transistor operation at higher collector current is possible while keeping the current gain at a stable value. Literatures Literature concerned with the transistor of the structure described above include, for example, JP-A No. 2002-359249.

SUMMARY OF THE INVENTION

However, also in the existent hetero bipolar transistor designed as in existent, example 1 described above, in a case where high current operation is required, a problem is still present that the effect of the hetero interface on the side of the collector greatly inhibits the transistor operation.

FIG. 4B shows an energy band diagram during low current operation in an npn-hetero bipolar transistor of existent example 1 and FIG. 4C shows an energy band diagram during high current operation of an npn-hetero bipolar transistor of existent example 1. In FIGS. 4B and 4C, Ec represents a conduction band and Ev represents a valence electron band. A dotted chain shows a junction portion and a broken line shows a depletion layer edge in a state where a voltage is not applied to the transistor. FIG. 4A schematically shows a concrete constitution of the npn-hetero junction. Usually, when a high current is applied to the npn-transistor (refer to FIG. 4C), many electrons are accumulated in the collector-base junction due to the finite carrier velocity to offset fixed charges in the depletion layer at the junction. The phenomenon results in increase of the base width, that is, the Kirk effect, and in a case of a bipolar transistor having the hetero interface also on the side of the collector, the hetero interface and the collector-base junction approach upon occurrence of the Kirk effect, in which the barrier for the conduction band Ec described above is caused to the hetero interface to greatly hinder the transistor operation.

FIG. 5 and FIG. 6 schematically show the current gain $h_{FE}$ and the collector current dependence of a cut-off frequency $f_T$ of a hetero bipolar transistor (HBT) respectively. Collector current Ic is expressed on the abscissa in common with FIGS. 5 and 6, current gain $h_{FE}$ is expressed on the ordinate in FIG. 5, and the cut-off frequency $f_T$ is expressed on the ordinate in FIG. 6. In each of the drawings, a fine line shows the characteristic of a silicon bipolar transistor (Si BJT) and a fat line shows the characteristic of a SiGe HBT. In the drawings, the value for the collector current usually used is shown as a working current Io.

As shown in FIG. 5 and FIG. 6, an abrupt lowering of the current gain and the cut-off frequency is shown in SiGe HBT and the transistor characteristic is poor relative to usual Si BJT. The phenomenon is more conspicuous as the concentration of the collector impurity is lower and tends to occur, particularly, in a transistor intended for higher voltage withstanding. Then, as illustrated, satisfactory characteristic can not be obtained around the working current Io in any of the characteristics. For example, in SiGe HBT with the withstanding voltage >8 V, the current gain at a current density of about 0.5 mA/μm² is decreased to 1/10 or less of the current gain at a low current.

As described above, in the so-called double hetero bipolar transistor as in existent example 1 having two hetero interfaces, degradation of the transistor characteristic application of high current has been an inevitable problem.

Further, in the use of the germanium distribution of existent example 2 described above for the existent example 1, decrease in the current gain $h_{FE}$ relative to the collector current Ic is moderated and the current gain can be kept to a certain value or more till a higher current as shown in the characteristic curve a1 in FIG. 8. The characteristic curve b1 shows a case of not using the germanium distribution of existent example 2.

However, as the working current value Io increases, since the depletion layer edge on the side of the collector is present in the gradient region of the germanium composition, current gain varies greatly to the collector current. Further, since the degree of the base width widening relative to the degree of the increase in the collector current is large, it is necessary to sufficiently increase the thickness of the silicon-germanium layer of the collector in order to suppress the occurrence of the energy barrier. However, since increase in the thickness of the silicon-germanium layer accompanies a worry for the occurrence of crystal defects caused by accumulation of distortions, this can not be an optimal countermeasure.

Further, in a case of inserting the delta doping layer with the impurity concentration being increased in the collector near the base-collector interface as in existent example 3 described above, while transistor operation at higher collector current is possible while keeping the current gain at a stable value as shown by the characteristic curve a2 in FIG. 9, the voltage withstanding decreases inevitably and this is not suitable to a case requiring a high voltage withstanding characteristic.

The present invention has been achieved with a view point of the foregoing problems and it intends to provide a semiconductor device capable of avoiding the occurrence of the barrier in the conduction band while keeping high voltage withstanding and capable of high speed transistor operation at high current in a hetero bipolar transistor, as well as a manufacturing method thereof.

One of typical inventions disclosed in the present application is as shown below. That is, a semiconductor device according to the invention includes a first conduction type first semiconductor layer buried in a semiconductor substrate, a first conduction type second semiconductor layer disposed above the first semiconductor layer, a first conduction type third semiconductor layer disposed above the second semiconductor layer and containing, at a portion thereof, a material having a smaller forbidden band width than that of the semiconductor substrate, a second conduction type fourth semiconductor layer disposed above the third semiconductor layer and having a smaller forbidden band width than that of the semiconductor substrate, and a first conduction type fifth semiconductor layer disposed above the fourth semiconductor layer, in which the fourth semiconductor layer has a region where the forbidden band width increases stepwise or continuously toward the third semiconductor layer, and the forbidden band width at the interface between the third semiconductor layer and the fourth semiconductor layer is larger than the smallest forbidden band width in the inside of the fourth semiconductor layer, and the forbidden band width is constant near the region where the forbidden band width is smallest in the inside of the fourth semiconductor layer.

Further, a method of manufacturing a semiconductor device according to the invention includes: forming a first conduction type first semiconductor layer above a semiconductor substrate, forming a first conduction type second semiconductor layer above the first semiconductor layer, forming a first conduction type third semiconductor layer containing, at a portion thereof, a material having a smaller forbidden band width than that of the semiconductor substrate above the second semiconductor layer and forming a second conduction type fourth semiconductor layer having a smaller forbidden band width than that of the semiconductor substrate above the third semiconductor layer, forming a first conduction type fifth semiconductor layer above the fourth semiconductor layer, in which the fourth semiconductor layer has a region where the forbidden band width increases stepwise or continuously toward the third semiconductor layer, and the forbidden band width at the interface between the third semiconductor layer and the fourth semiconductor layer is larger than the smallest forbidden band width in the inside of the fourth semiconductor layer, and the forbidden band width is constant near the region where the forbidden band width is most smallest in the inside of the fourth semiconductor layer.

According to the invention, abrupt decrease of the current gain and the cut-off frequency upon high current application which has the caused problems so far in the hetero bipolar transistor can be suppressed while maintaining the high voltage withstanding performance of the transistor as it is.

BRIEF DESCRIPTION OF THE DRAWINGS

FIGS. 1A and 1B are diagrams for an impurity distribution and a germanium distribution of Example 1 of a semiconductor device according to the invention in which FIG. 1A shows the germanium distribution and FIG. 1B shows the impurity distribution;

FIGS. 3A and 3B are diagrams for an impurity distribution and a germanium distribution of Example 1 of a semiconductor device according to the invention in which FIG. 3A shows the germanium distribution and FIG. 3B shows the impurity distribution;

FIG. 4A schematically shows a concrete constitution of an npn-hetero junction;

FIG. 4B is an energy band diagram during low current operation of a bipolar transistor of existent example 1;

FIG. 4C is an energy band diagram during high current operation of a bipolar transistor of existent example 1;

FIGS. 7A and 7B are diagrams for an impurity distribution and a germanium distribution of Example 2 of a semiconductor device according to the invention in which FIG. 7A shows the germanium distribution and FIG. 7B shows the impurity distribution;

FIGS. 14A and 14B are diagrams for an impurity distribution and a germanium distribution of Example 2 of a semiconductor device according to the invention in which FIG. 14A shows the germanium distribution and FIG. 14B shows the impurity distribution;

FIGS. 16A and 16B are diagrams for an impurity distribution and a germanium distribution of Example 3 of a semiconductor device according to the invention in which FIG. 16A shows the germanium distribution and FIG. 16B shows the impurity distribution;

FIGS. 17A and 17B are diagrams for an impurity distribution and a germanium distribution of Example 4 of a semiconductor device according to the invention in which FIG. 17A shows the germanium distribution and FIG. 17B shows the impurity distribution;

FIGS. 19A and 19B are diagrams for an impurity distribution and a germanium distribution of Example 5 of a semiconductor device according to the invention in which FIG. 19A shows the germanium distribution and FIG. 19B shows the impurity distribution.

DETAILED DESCRIPTION OF THE PREFERRED EMBODIMENTS

A semiconductor device and a manufacturing method of according to the invention are to be described specifically by way of several preferred examples with reference to the appended drawings.

Example 1

Figure 1A:
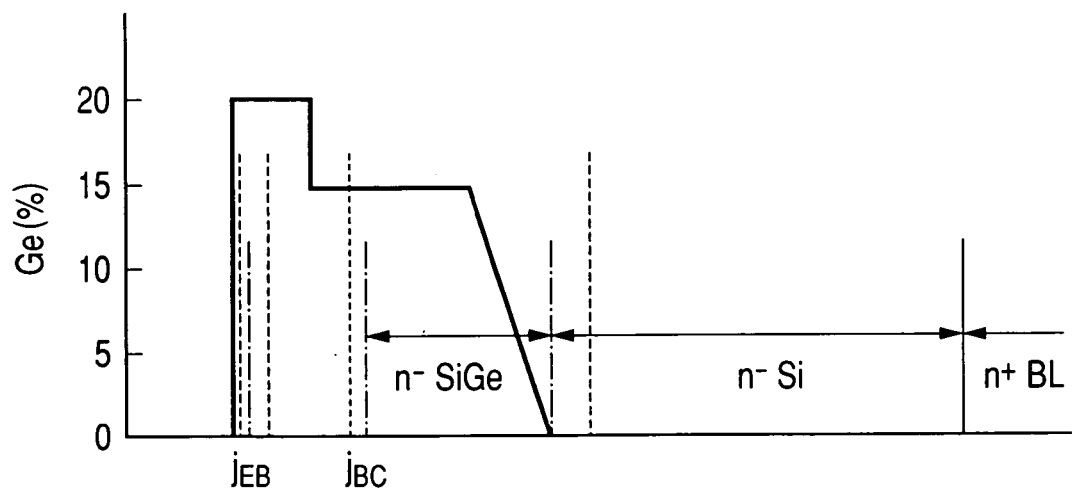
Figure 1B:
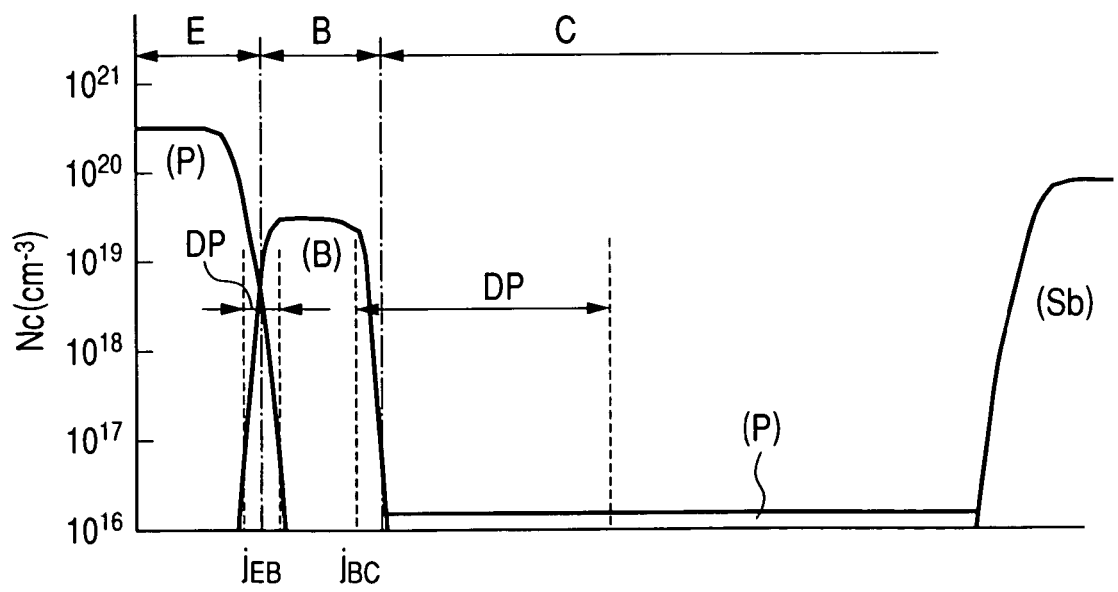

FIG. 1A and FIG. 1B are diagrams showing an impurity profile in a main portion of a silicon-germanium (SiGe) hetero bipolar transistor as a first example of a semiconductor device according to the invention, in which FIG. 1B shows a distribution of the impurity concentration Nc ($cm^{-3}$) and FIG. 1A shows a distribution of a germanium composition (%).

For the scale of easy understanding of the relation between the germanium distribution and the impurity concentration distribution, an identical scale is used for the abscissa in common with FIG. 1A and FIG. 1B. Further, a broken line in the drawings shows the depletion layer edge in a state where a voltage is not applied to the transistor. A silicon-germanium layer is formed above an n-collector buried layer ($n^+$ BL) at a high concentration and an n-silicon layer ($n^-$Si) at low concentration formed above the silicon substrate. The silicon-germanium layer is distributed so as to cover the p-base and the hetero interface between the silicon layer and the silicon-germanium layer on the side of the emitter is situated near the junction $j_{EB}$ of the n-emitter and the p-base.

On the other hand, n-silicon-germanium layer ($n^-$SiGe) is formed on the collector side such that the hetero interface is situated at a certain distance from the junction $j_{BC}$ between the p-base and the n-collector. In the intrinsic base, a region where the germanium concentration decreases from the emitter side to the collector side is present. The germanium composition is constant near the region where the germanium composition is at the maximum, and the germanium composition at the depletion layer edge on the side of the collector in the intrinsic base is smaller compared with the maximum value of the germanium composition in the intrinsic base. Since the intrinsic base width changes depending on the operation state of the transistor, the position at which the germanium composition is decreased is controlled so as to always satisfy the condition during transistor operation in the invention.

For example, in a case where the p-impurity concentration is $1 \times 10^{19}$ $cm^{-3}$ in the p-silicon-germanium layer, the n-impurity concentration is $1 \times 10^{16}$ $cm^{-3}$ in the collector, and the withstanding voltage of the transistor is 10 V, it is preferred that the region of decreasing the germanium composition is spaced by a distance of 1.2 nm or more from the interface between the p-silicon-germanium layer and the n-silicon-germanium layer.

In this example, the germanium composition decreases stepwise in the inside of the base and the amount of decrease is desirably one-half or less for the peak value of the germanium composition in the base.

Further, in a case where the germanium composition has such a gradation to decrease toward the collector at the vicinity of the interface relative to the low concentration n-silicon layer in the n-silicon-germanium layer the effect of the invention is further enhanced. In a high withstanding voltage bipolar transistor where the n-impurity concentration of the collector is $1 \times 10^{16}$ $cm^{-3}$, it may suffice that the n-silicon layer at low concentration may be of about 1 μm.

In the thus designed transistor, the germanium composition at the base layer edge on the side of the collector can be decreased compared with existent example 1 while keeping the germanium composition near the emitter-base identical with that in the existent example 1, and the height of the energy barrier formed upon increase of the collector current can be decreased.

Further, since the germanium composition of the n-silicon-germanium layer is decreased compared with that in the existent example 1, the thickness of the n-silicon-germanium layer in the collector can be increased to retard the generation of the energy barrier relative to increase of the collector current.

Figure 10A:
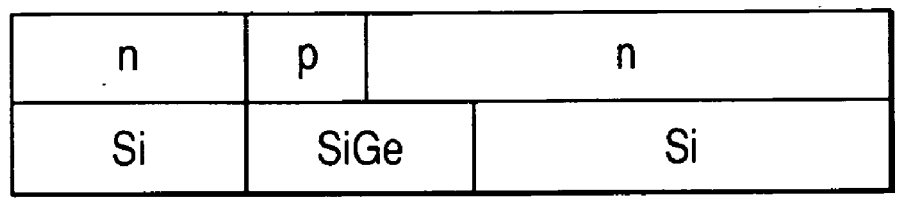
FIG. 10A schematically shows a concrete constitution of an npn-hetero junction.
Figure 10B:
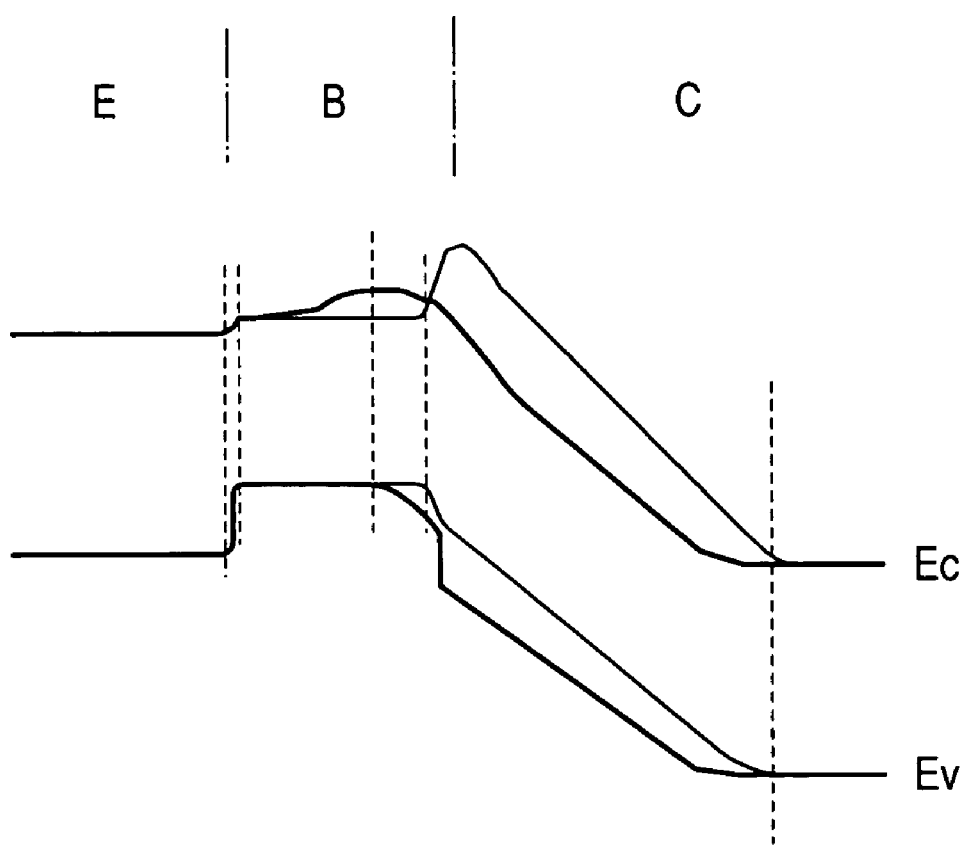
FIG. 10B is an energy band diagram during high current operation in comparison between Example 1 and existent example 1.

FIG. 10B shows an energy band diagram at high current operation of the npn-hetero bipolar transistor of this example by a fat line. As a comparison, the energy band diagram in a case of high current operation in existent example 1 is shown by a fine line. FIG. 10A schematically shows a concrete constitute of an npn-hetero junction. As shown in FIG. 10B, while small energy barrier is formed due to the decrease of the germanium composition in the inside of the intrinsic base, the energy barrier generated upon increase of the working current to increase the base width can be suppressed greatly and high current gain and cut-off frequency can be kept as far as a higher current. This can be understood in view of the characteristics in FIG. 11 and FIG. 12.

Figure 11:
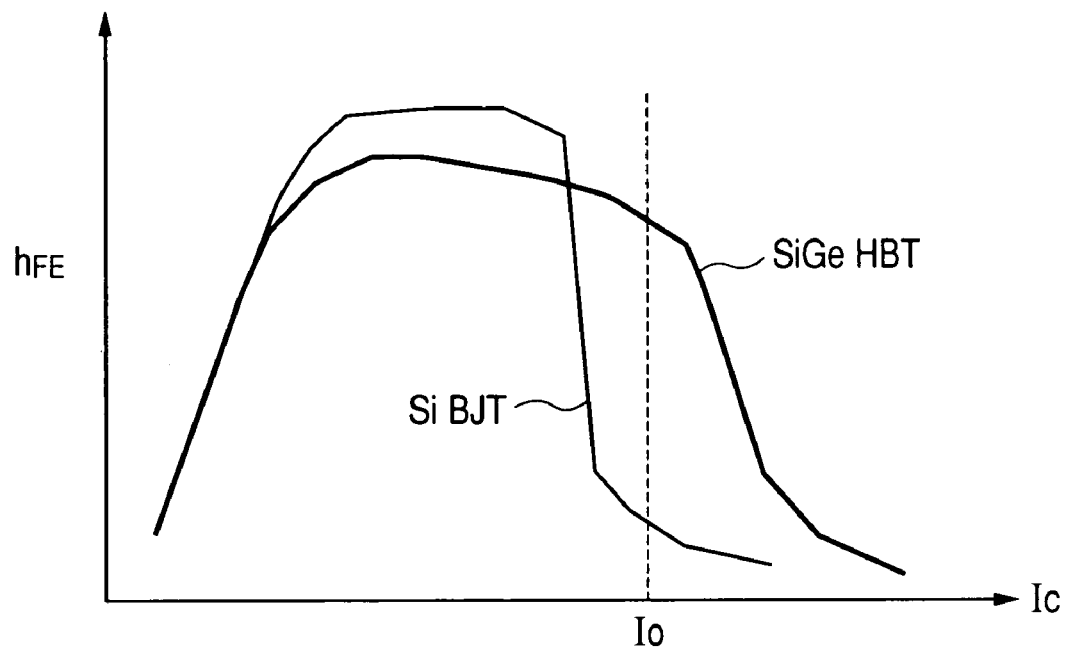
FIG. 11 is a diagram showing a relation between a current gain and a working temperature in comparison between Example 1 and existent example 1.
Figure 12:
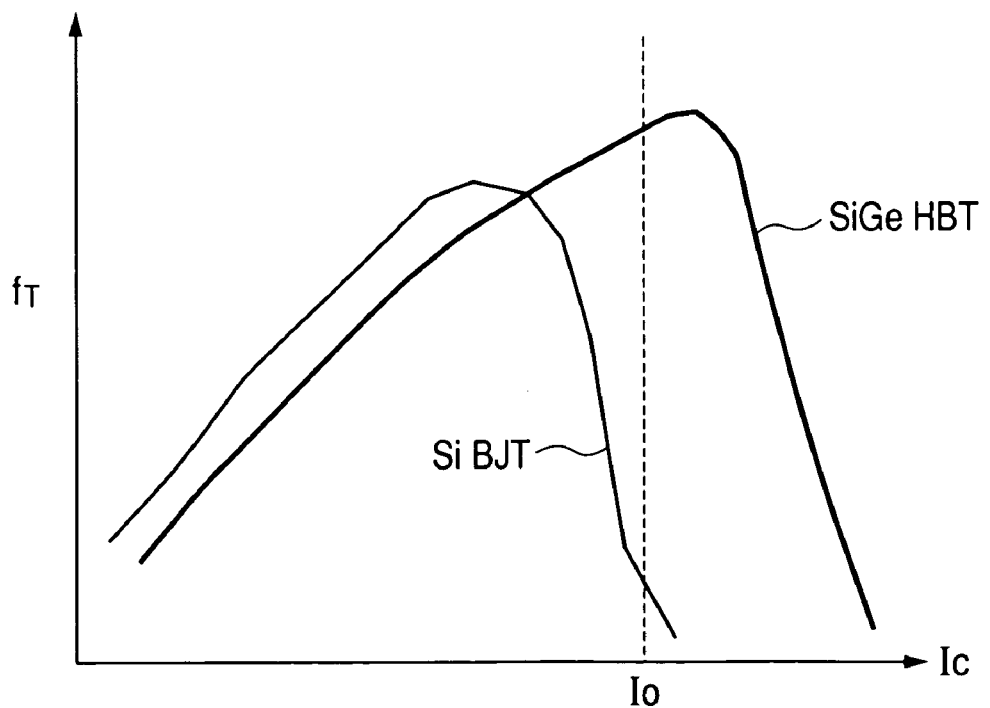
FIG. 12 is a diagram showing a relation between a cut-off frequency gain and a working temperature in comparison between Example 1 and existent example 1.

FIG. 11 and FIG. 12 schematically show the collector current dependence of the current gain $h_{FE}$ and the cut-off frequency $f_T$ respectively in the hetero bipolar transistor of this example. In the drawings, the abscissa expresses the collector current Ic and the ordinate expresses the current gain in FIG. 11 and the cut-off frequency in FIG. 12. In each of the drawings, a fine line shows a characteristic curve for Si BJT and a fat line shows a SiGe HBT characteristic line. Then, the value of the collector usually used current is shown as Io. For the current gain in FIG. 11, while the value decreases during low current operation due to the effect of the energy barrier in the intrinsic base shown in FIG. 10, a great increase is shown at the working current Io and sufficient characteristic is ensured compared with the existent example 1. The value varies less near the working current Io and scattering can also be suppressed. Also for the cut-off frequency $f_T$ in FIG. 12, while the value in the low current operation decreases compared with existent example 1, the current giving a peak value increases greatly compared with the existent example and high speed transistor operation at high current is ensured.

Figure 2:
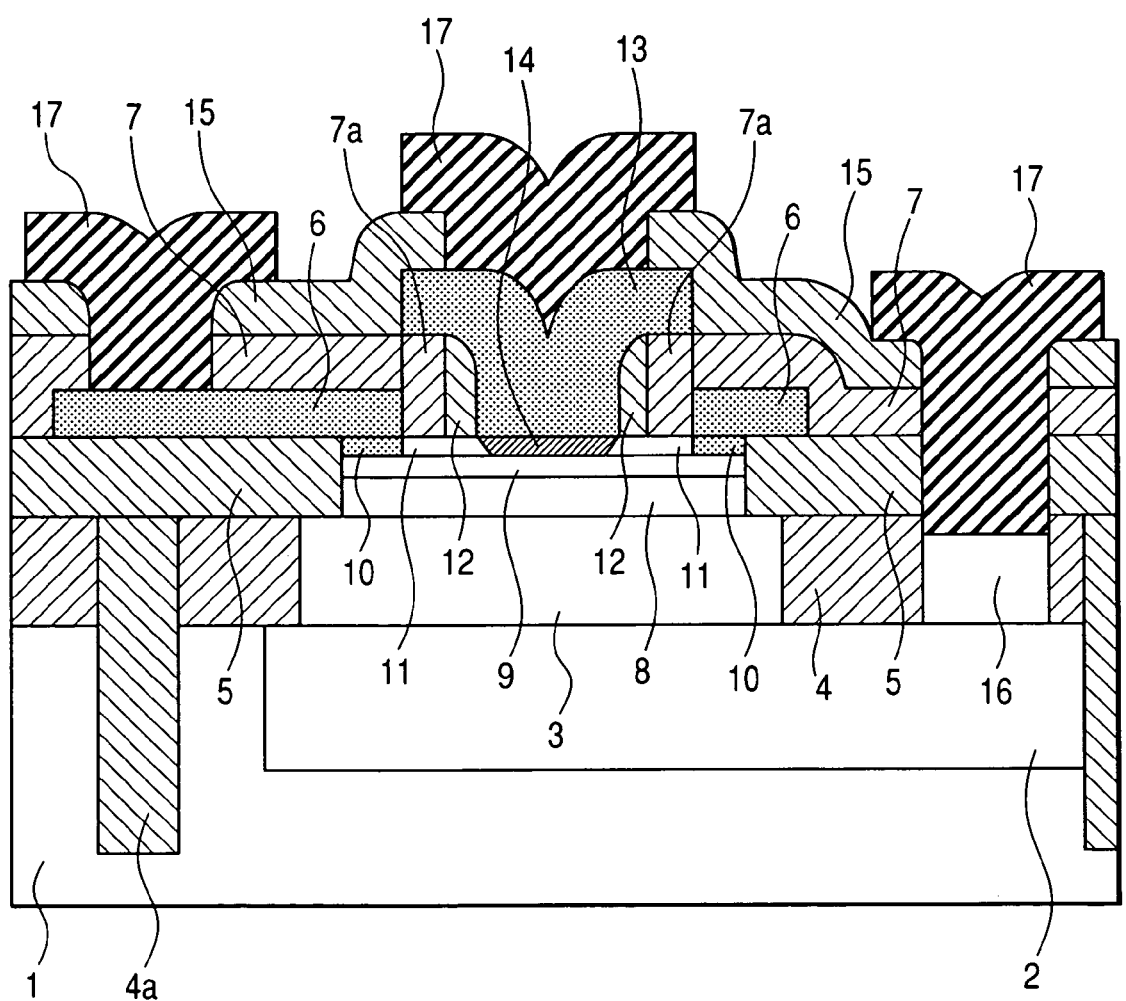
FIG. 2 is a cross sectional view of Example 1 of the semiconductor device according to the invention.
Figure 3A:
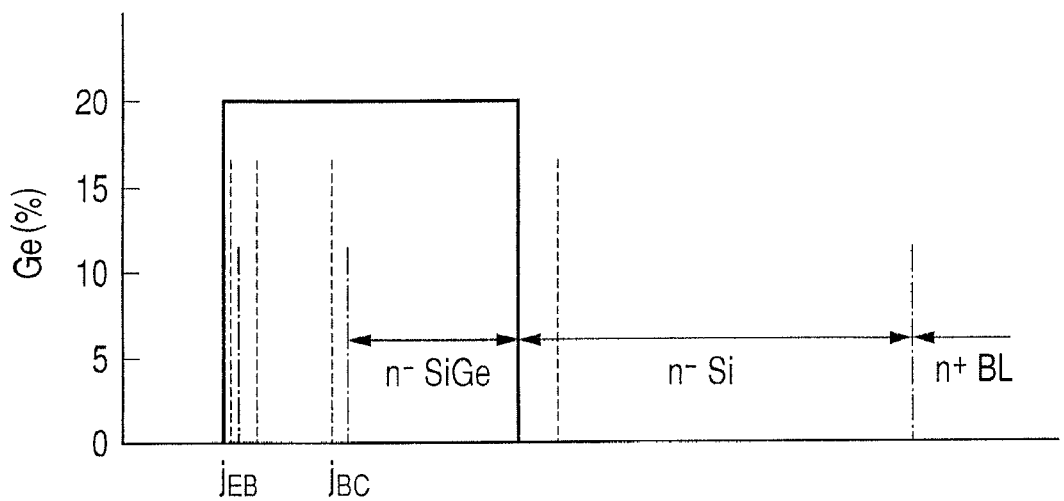
Figure 3B:
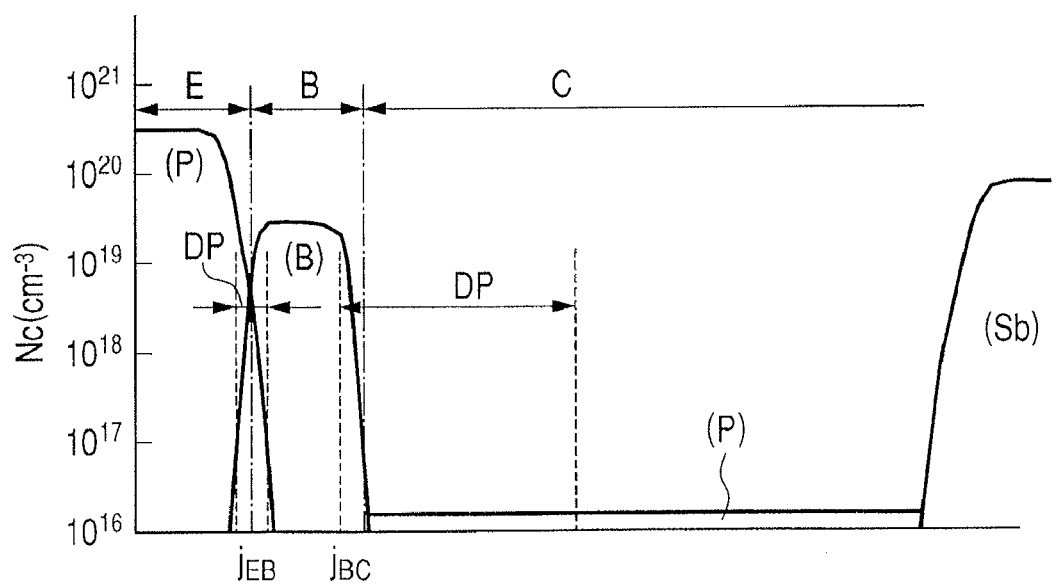
Figure 5:
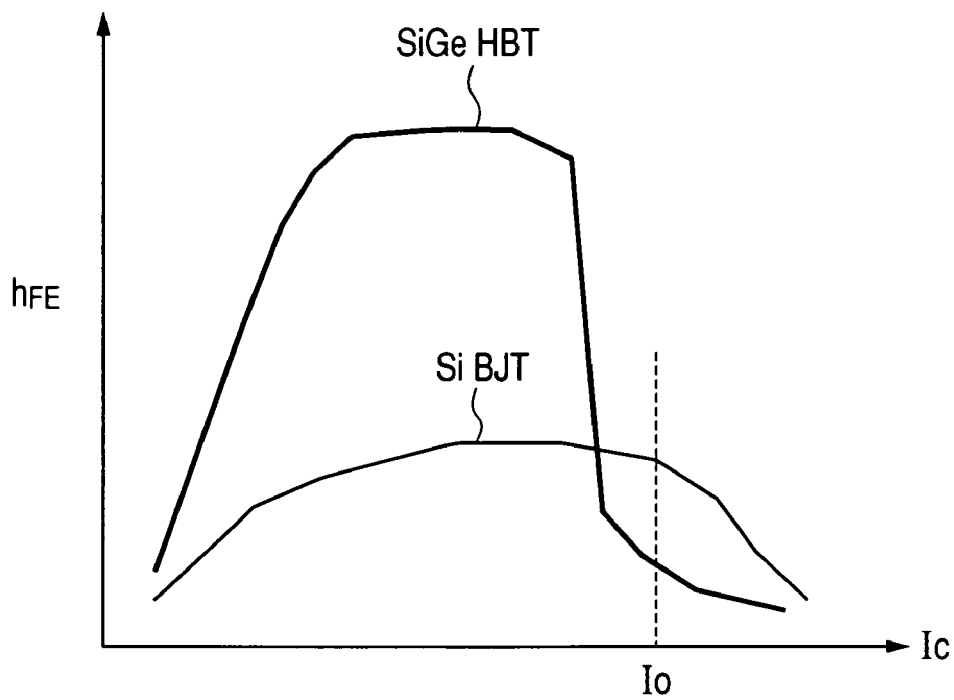
FIG. 5 is a view showing a relation between a current gain and a working current in a bipolar transistor of existent example 1.
Figure 6:
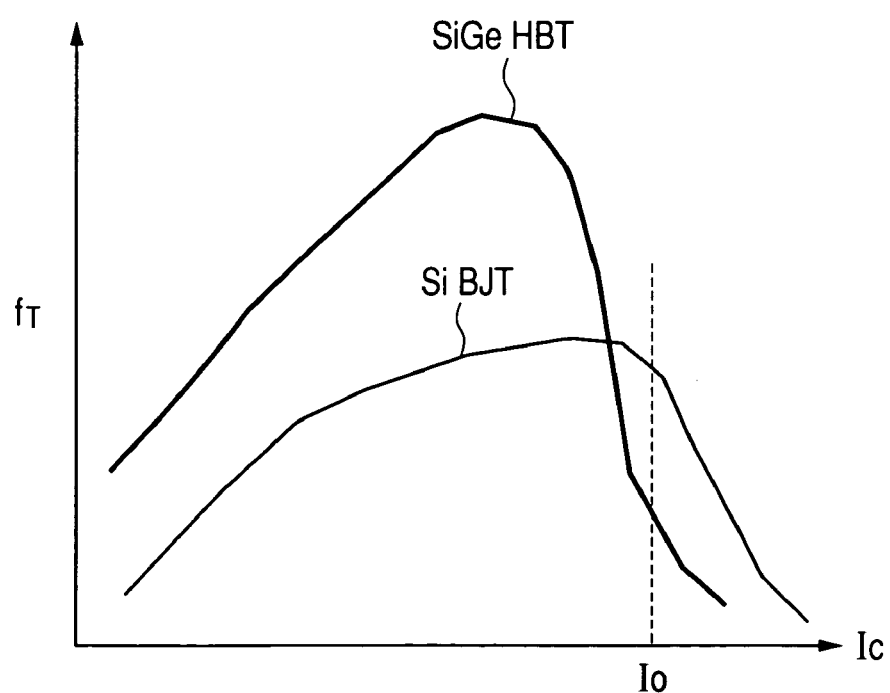
FIG. 6 is a view showing a relation between a cut-off frequency and a working current in a bipolar transistor of existent example 1.
Figure 7A:
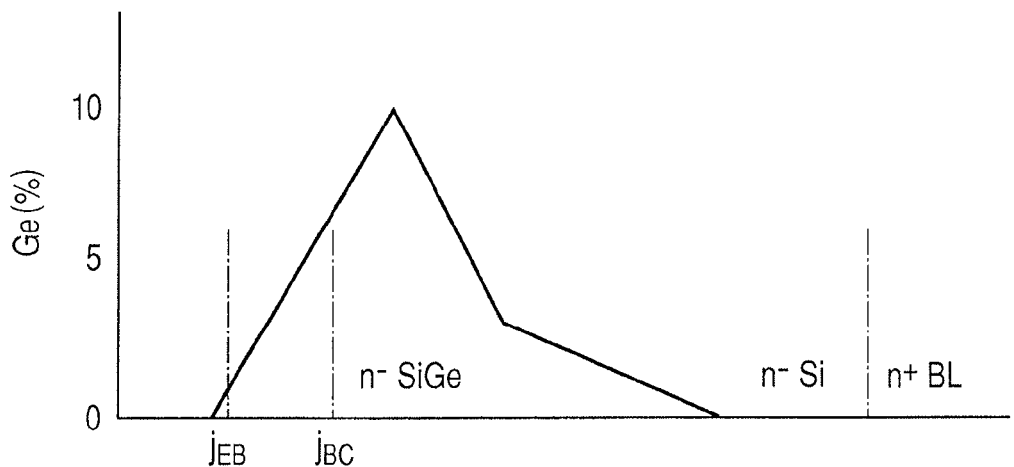
Figure 7B:
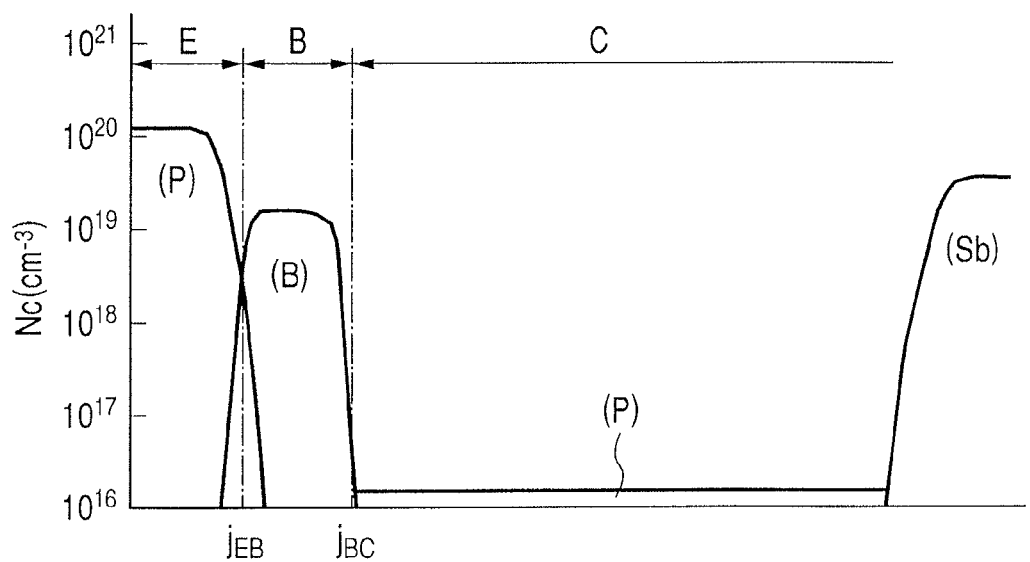
Figure 8:
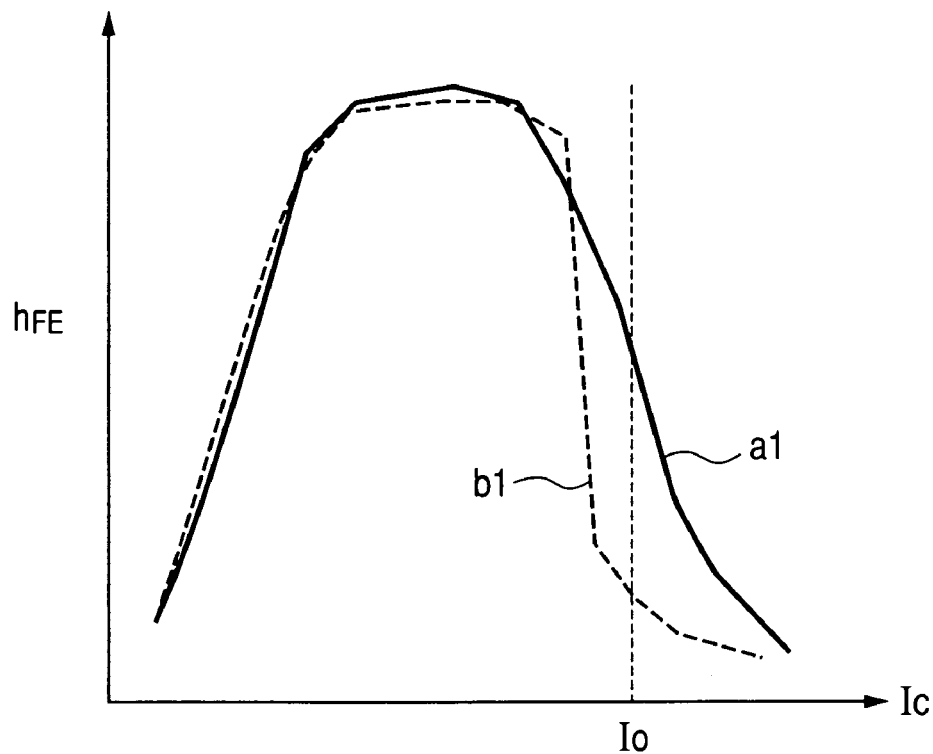
FIG. 8 is a diagram showing a relation between a current gain and a working current in a case of using the germanium distribution of existent example 2 to existent example 1.
Figure 9:
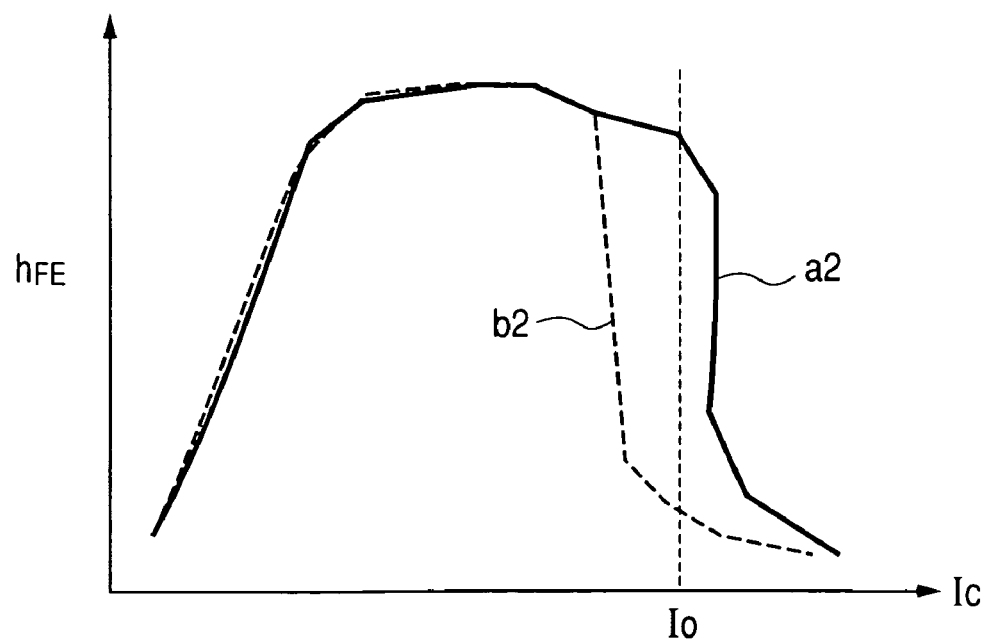
FIG. 9 is a diagram showing the effect of the current gain on the working characteristic in existent example 3.

FIG. 2 shows a cross sectional structure for a main portion of a semiconductor device in this example. A high concentration collector buried layer 2 is present in a p-silicon substrate 1. A low concentration n-silicon layer 3 is formed above the buried layer 2 to form a collector layer. It is desirable that the thickness of the collector layer is about 1 µm. A low concentration n-silicon-germanium layer 8, a p-silicon-germanium layer 9, and an n-silicon or silicon-germanium layer 14 are formed within an opening area surrounded with a dielectric film 5, to constitute collector, base, and emitter layers respectively. In this structure, the germanium composition in the low concentration n-silicon-germanium layer 8 and p-silicon germanium layer 9 is controlled so as to provide a profile shown in FIG. 1.

Then, a specific method of manufacturing a semiconductor device in this example is to be described specifically with reference to FIG. 2 and FIGS. 13A to 13D.

At first, after adding n-impurities of arsenic or antimony by ion implantation to a portion of a region of the silicon substrate 1, a high concentration n-collector buried layer 2 (first conduction type first semiconductor layer) is formed by thermal diffusion. Successively, by epitaxial growing, a first collector layer 3 comprising a low concentration n-single crystal silicon (first conduction type second semiconductor layer) is deposited. Further, a dielectric film 4 and a dielectric film 4a are selectively formed excepting a transistor forming region and a collector extension electrode region to conduct device isolation (refer to FIG. 13A).

As a method of forming the device isolation structure, a low concentration n-silicon layer may be formed by epitaxial growing over the silicon substrate 1 and the low concentration n-silicon layer may be oxidized selectively while leaving the first collector region 3 and a collector lead electrode region 17. Alternatively, after forming a low concentration n-silicon-layer, a device isolation region may be engraved by lithography, dielectric films 4, 4a may be buried, and the surface may be planarized, for example, by chemical mechanical polishing (CMP). Further, the isolation structure can also be formed by deposited the dielectric films 4, 4a above the silicon substrate, forming an opening and then selectively forming a first collector region 3 and a collector extension electrode region 16 by epitaxial growing or the like.

Then, a dielectric film 5, a base extension electrode 6 comprising a high concentration p-polycrystal silicon or high concentration p-polycrystal silicon-germanium, and a dielectric film 7 are formed over the entire surface. The p-impurity of the base extension electrode 6 may be injected by ion implantation, or it may be added upon deposition.

Figure 13A:
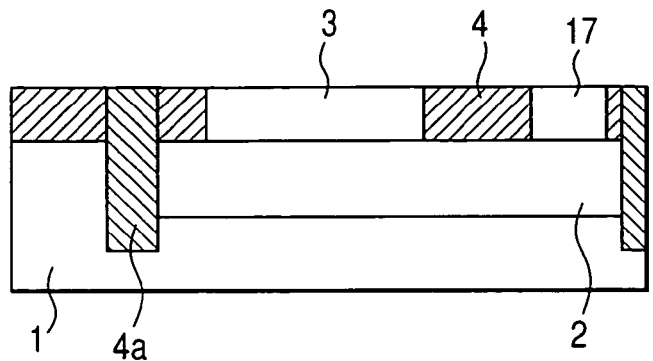
FIGS. 13A to FIG. 13D are cross sectional views showing the method of manufacturing of a semiconductor device in Example 1 according to the invention.
Figure 13B:
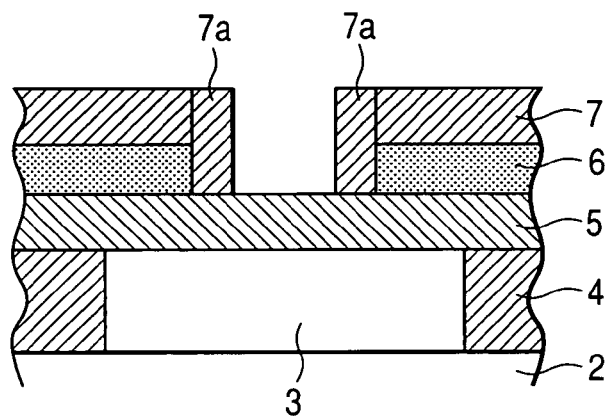

Successively, an opening is formed to a multi-layer film comprising the base electrode 6 and the dielectric film 7 by lithography and dry etching and, further, a dielectric film is deposited and dry etching is applied to form an emitter-base separation dielectric film 7a in the opening (refer to FIG. 13B).

Figure 13C:
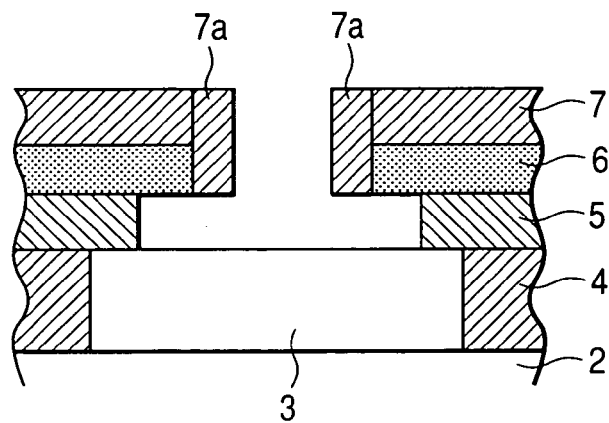
Figure 13D:
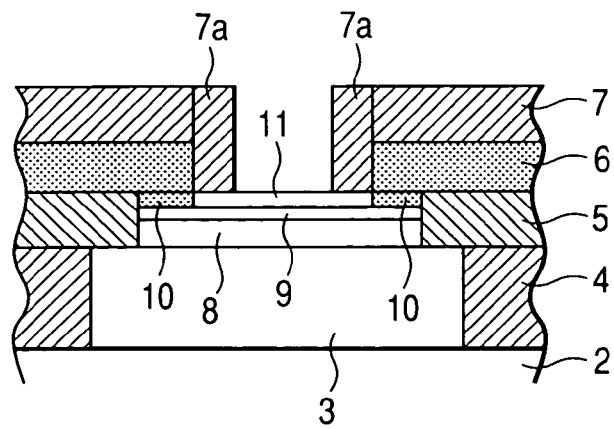

FIG. 13B to FIG. 13D show the structure above the first collector region 3 and the structure below the first collector region 3 is identical with that in FIG. 13A.

Then, the dielectric film 5 is selectively etched to form an opening in a portion below the base electrode 6 to provide a collector-base forming region. For example, it is preferred to use a silicon nitride film for the dielectric film 5 and a silicon oxide film for the dielectric films 7 and 7a in this step. In this case, since the dielectric film 5 is selectively etched relative to the dielectric film 7 and the dielectric film 7a by using phosphoric acid at 80° C., a structure as shown in FIG. 13C is obtained.

Then, a single crystal n-silicon-germanium layer 8 as a second low concentration n-collector (first conduction type third semiconductor layer) is deposited by 30 nm to 40 nm, a single crystal p-silicon-germanium 9 (second conduction type fourth semiconductor layer) as a base is deposited by 1 nm to 10 nm and, further, a low concentration single crystal silicon layer 11 (first conduction type fifth semiconductor layer) is deposited at 5 nm to 20 nm, and they are deposited respectively by selective epitaxial growing (FIG. 13D).

In this case, the germanium composition for the n-silicon-germanium layer and the p-silicon-germanium layer is designed so as to provide a profile shown in FIG. 1. A p-external base layer 10 comprising polycrystal silicon-germanium is formed simultaneously with the base layer 9. This example adopts a growing technique of not causing the growing of polycrystal silicon-germanium to a portion below the base electrode 6 does not occur during growing of the second collector layer 3 but occurs after the growing of the base layer 9.

The growing technique utilizes the difference between the time for starting growing of single crystal silicon and the time for starting growing of polycrystal silicon on polycrystal silicon (or difference between the time for starting growing of silicon-germanium on silicon-germanium and a time for starting growing of polycrystal silicon-germanium on polycrystal silicon-germanium), which is a nature inherent to a gas source molecular beam epitaxy (MBE) or chemical vapor deposition (CVD). Particularly, the controllability is favorable in the CVD method and favorable conditions are obtained under the growing conditions at a temperature of 100 Pa or less and at a temperature of from 500° C. to 700° C.

Then, phosphorus as the n-impurity is doped by ion implantation through the opening in FIG. 13D. However, in a transistor of high withstanding voltage rating as adopted in this example, the ion implantation step may be saved sometimes.

Then, after depositing the dielectric film entirely, an emitter-base isolation dielectric film 12 is formed by dry etching and the opening is buried with an emitter electrode 13 comprising high concentration n-polycrystal silicon. Successively, heat treatment is applied to diffuse n-impurities from the emitter electrode, and an emitter region 14 is formed in the single crystal silicon layer 11. Then, patterning is applied to the base extension electrode 6 and the emitter electrode 13. An oxide film 15 is deposited over the entire surface, an opening each of the regions for the base extension electrode 6, the emitter electrode 13 and the collector extension electrode 16, to form an electrode 17 (refer to FIG. 2). In this example, while description has been made for a self-aligned transistor structure capable of decreasing the parasitic capacitance, so long as the bipolar transistor has the profile shown in FIG. 1, the structure may be in any other form.

Further, in this example, while the first and the second collectors, the base, and the emitter comprise single crystal silicon-germanium respectively. Also, they may be of single crystal silicon-germanium-carbon. Particularly, use of a single crystal silicon-germanium-carbon layer for the base layer can suppress diffusion of boron (B) as the impurity of the base by the heat treatment during the process to provide an effect capable of obtaining an abrupt base layer. This is also identical in the examples to be described later.

Example 2

Figure 14A:
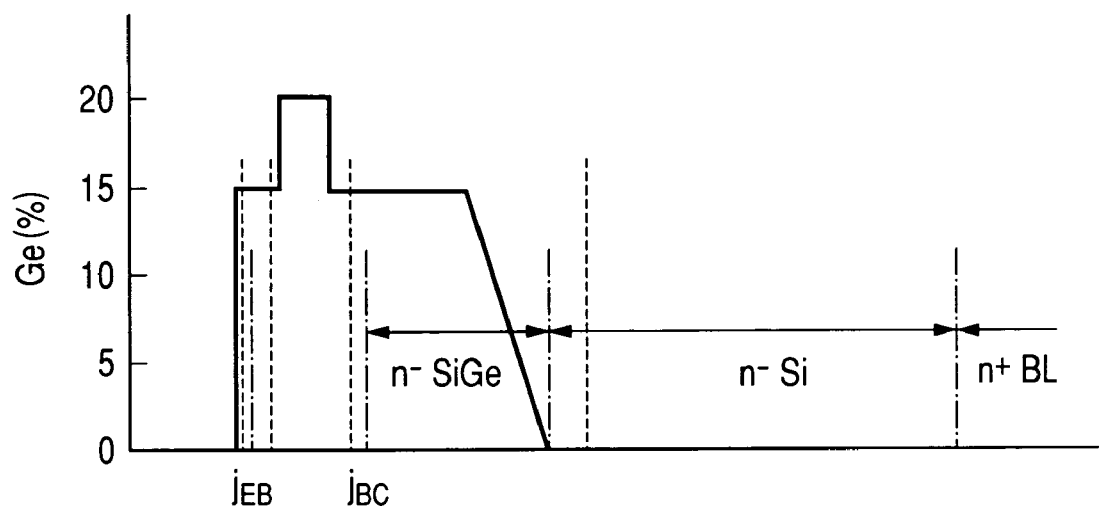
Figure 14B:
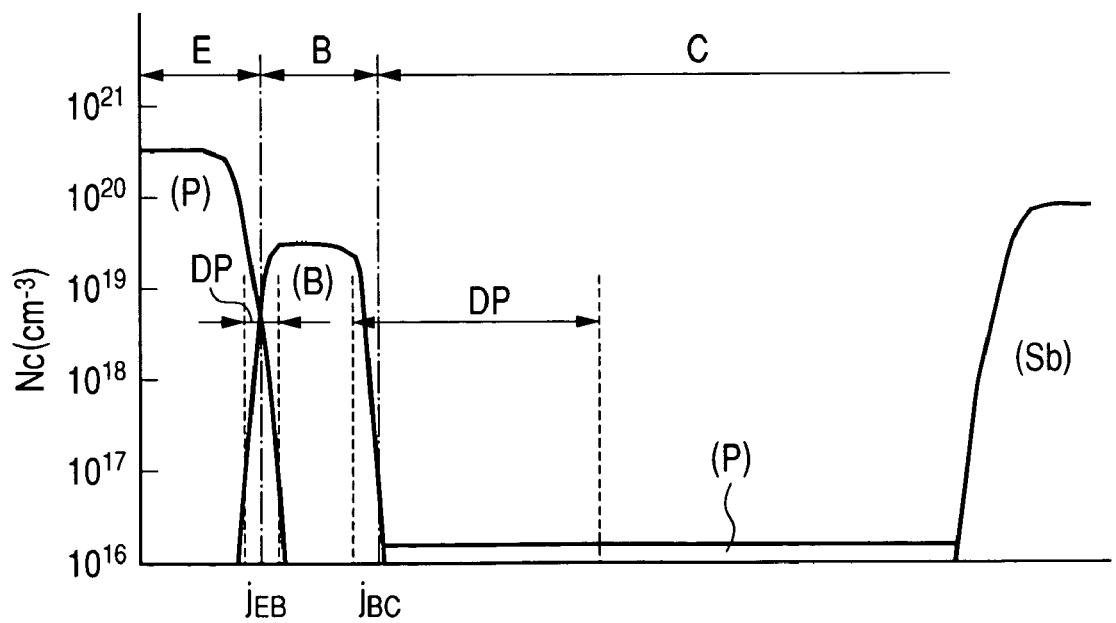

FIGS. 14A and 14B are distribution diagrams for impurities and germanium in the main portion showing a second example of SiGe HBT as a second example of the semiconductor device according to the invention. A broken line in the drawing shows a depletion layer edge in a state of not applying a voltage to the transistor. This example had a feature of including a region where the germanium composition increases from the emitter side to the collector side in the inside of the base layer near the emitter. In the region where the germanium composition increases, the forbidden band width is narrowed toward the collector and an acceleration electric field is applied in the intrinsic base to accelerate electrons. Accordingly, decrease of the current gain due to the generation of the energy layer in the intrinsic base is compensated. Accordingly, as in Example 1 of FIG. 1, decrease of the current gain due to the generation of the energy barrier in the intrinsic base is compensated and higher current gain and cut-off frequency can be attained in a high current region.

The effect of this example is to be shown by using the result of experiment shown in FIGS. 14A and 14B. In the experiment, it is designed that the germanium composition on the side of the emitter was about 15%, the highest germanium composition in the base was about 20%, the germanium composition on the side of the collector was about 15%, and the region where the germanium composition decreased is at about 3 nm from the depletion layer edge of the base on the side of the collector. In this case, the base width was 20 nm, the impurity concentration for the base and the collector was about $1 \times 10^{19}$ cm$^{-3}$ and $1 \times 10^{16}$ cm$^{-3}$, respectively.

Figure 15:
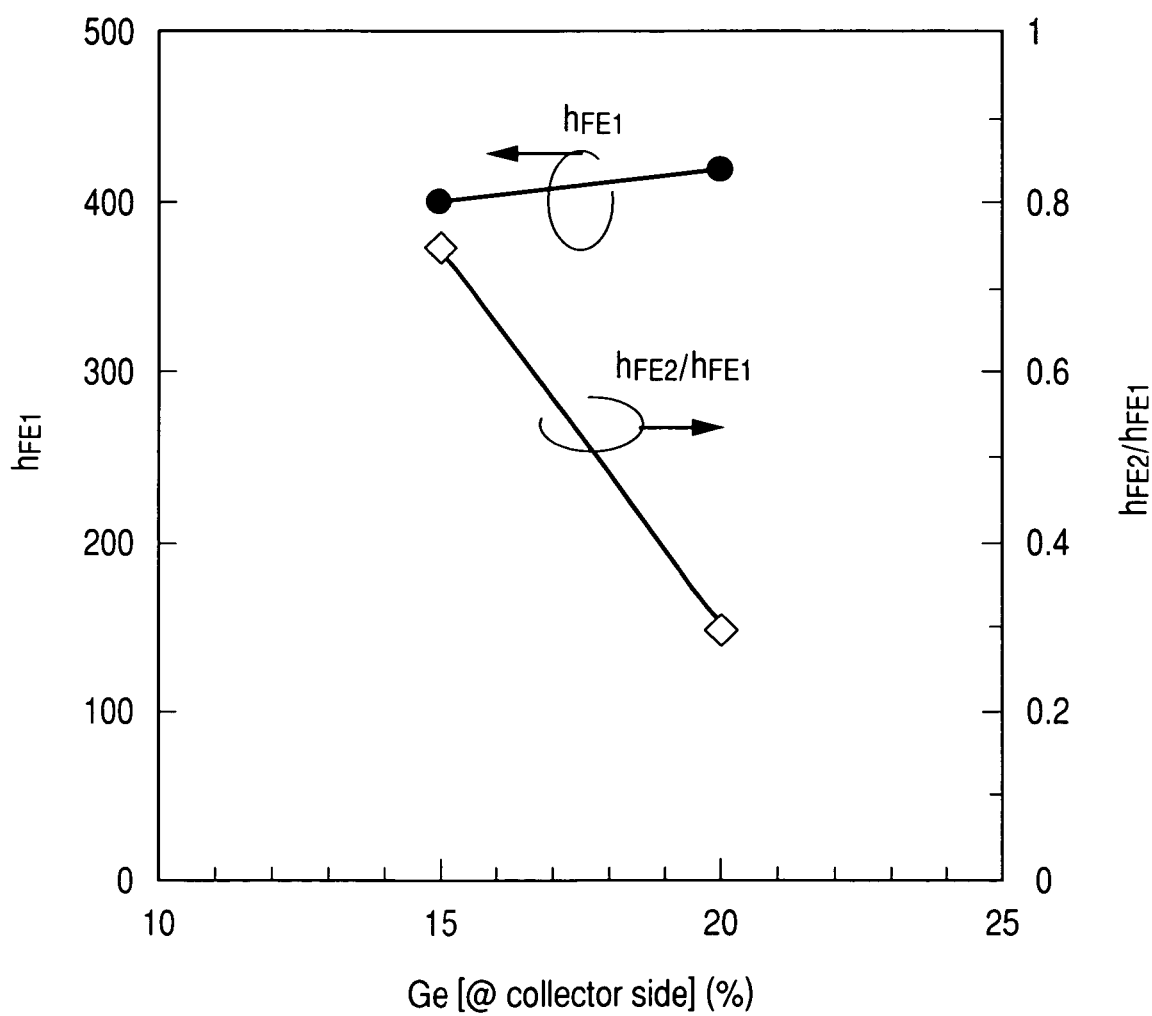
FIG. 15 shows the result of experiment showing the effect of Example 2 of a semiconductor device according to the invention.

FIG. 15 shows the current gain $h_{FE1}$ on the left ordinate and a ratio ($h_{FE2}/h_{FE1}$) between the current gains $h_{FE2}$ and $h_{FE1}$ on the right ordinate assuming the current gain at a collector current density of 5 μA/μm$^2$ as $h_{FE1}$ and the current gain at a collector current density of 0.5 mA/μm$^2$ as $h_{FE2}$. In FIG. 15, the abscissa shows a germanium composition at the interface between the p-silicon-germanium layer and the n-silicon-germanium layer. That is, the germanium composition=20% shows the result of experiment corresponding to the existent example in which the decreasing region of the germanium composition is not present in the base layer.

It can be seen from FIG. 15 that SiGe HBT of this example can greatly improve the current gain $h_{FE2}$ at a high current while keeping the current gain $h_{FE1}$ at a low collector current substantially equal with that in the existent example.

Example 3

Figure 16A:
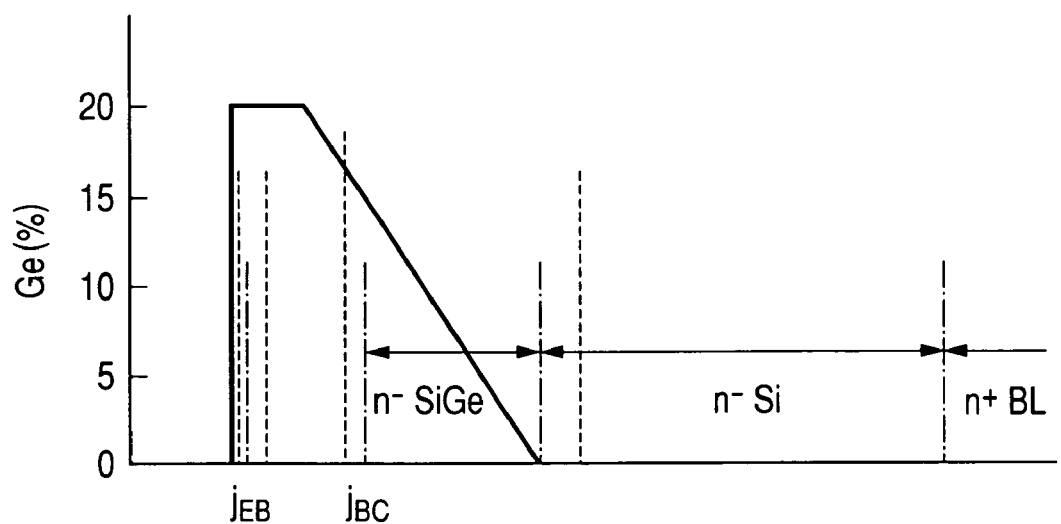
Figure 16B:
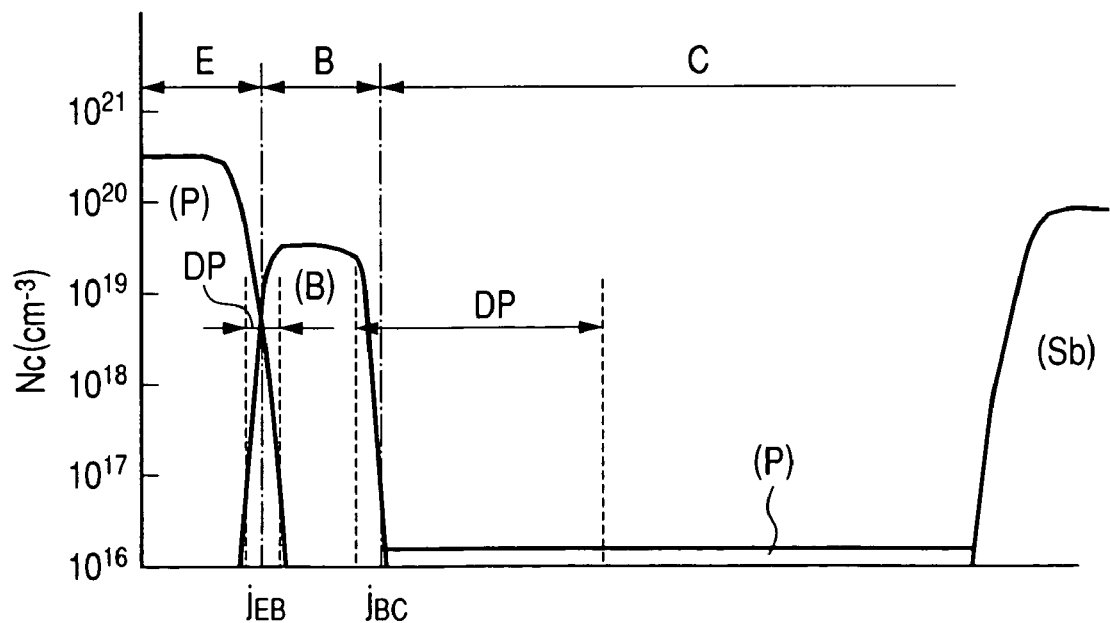

FIGS. 16A and 16B are diagrams showing the distribution of impurities and germanium in the main portion of SiGe as a third example of a semiconductor device according to the invention. A broken line in the drawing shows a depletion layer edge in a state of not applying a voltage to the transistor. This example has a feature that the germanium composition decreases continuously from the inside of the intrinsic base to the interface between the germanium layer and the low concentration n-silicon layer. By the provision of this profile, it is possible to decrease the height of the energy barrier generated at once upon increase of the collector current. This example can be used in combination with Example 2, to provide a profile that the germanium composition near the emitter-base junction in the intrinsic base increases toward the collector.

Example 4

Figure 17A:
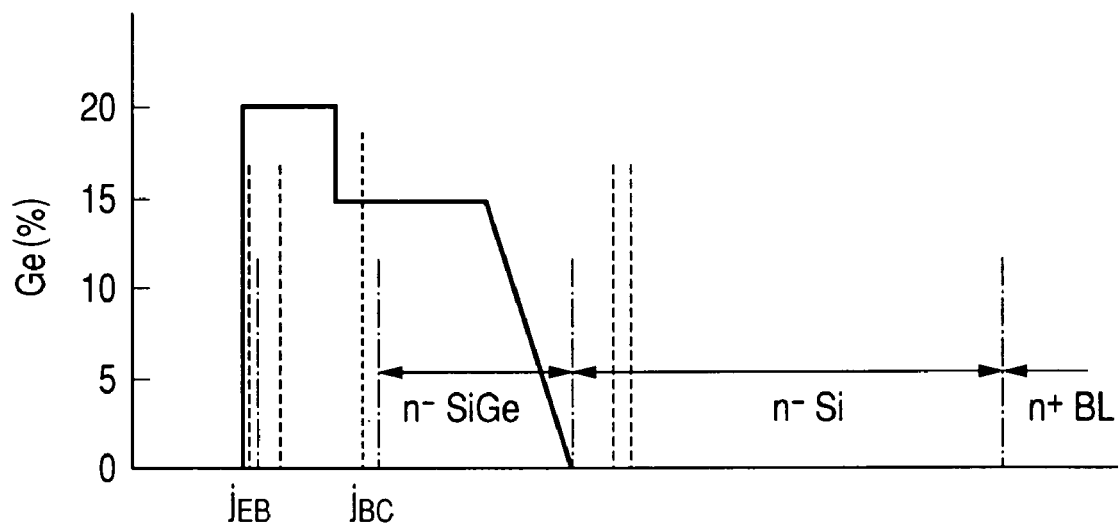
Figure 17B:
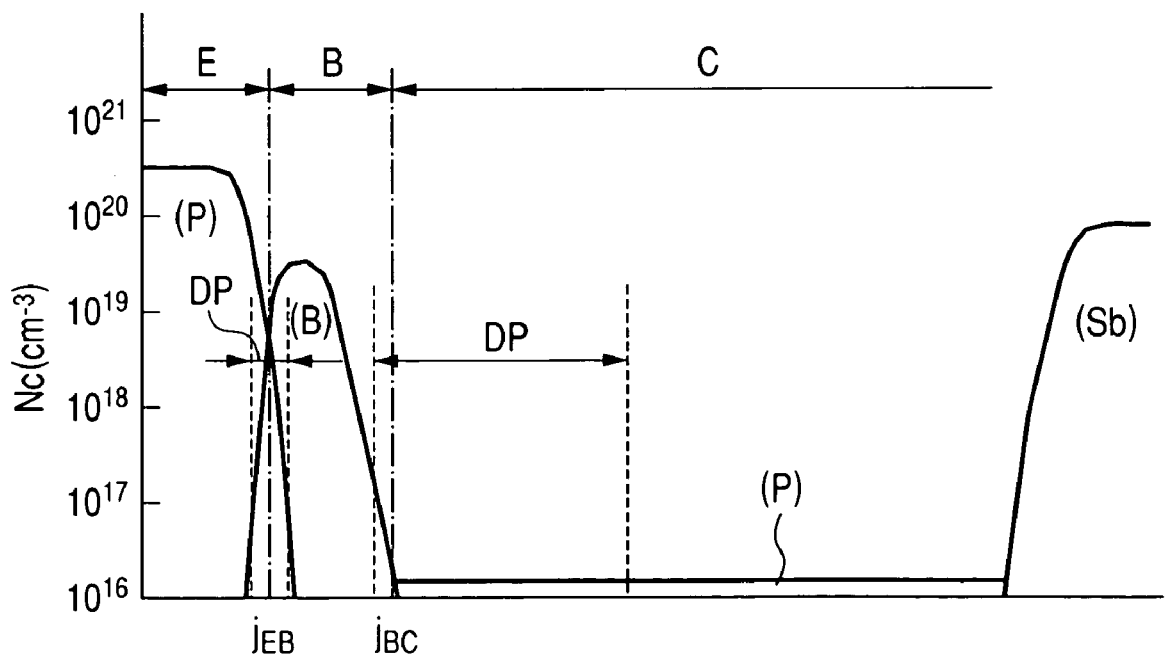
Figure 18:
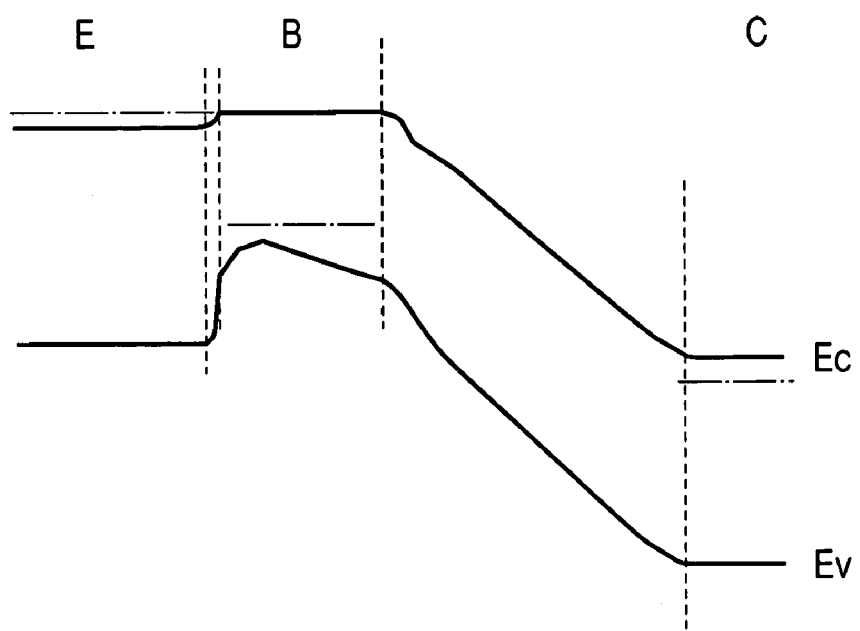
FIG. 18 is an energy band diagram during transistor operation in Example 4.

FIGS. 17A and 17B show distributions of impurities and germanium in a main portion of SiGe HBT as a fourth example of the semiconductor device according to the invention. This example has a feature of including a profile of decreasing p-impurity in the base simultaneously in a region where the germanium composition decreases in the base as shown in FIG. 17B. FIG. 18 is an energy band diagram during transistor operation in this example. By providing a gradation to the impurity profile, an internal electric field can be applied in the intrinsic base to compensate the energy barrier generated due to the decrease of the germanium composition. Accordingly, the current gain is not decreased also during low current operation and the current gain can be improved remarkably during high current operation. Further, the distribution of the germanium composition may be used in combination with Example 2 or Example 3.

Example 5

Figure 19A:
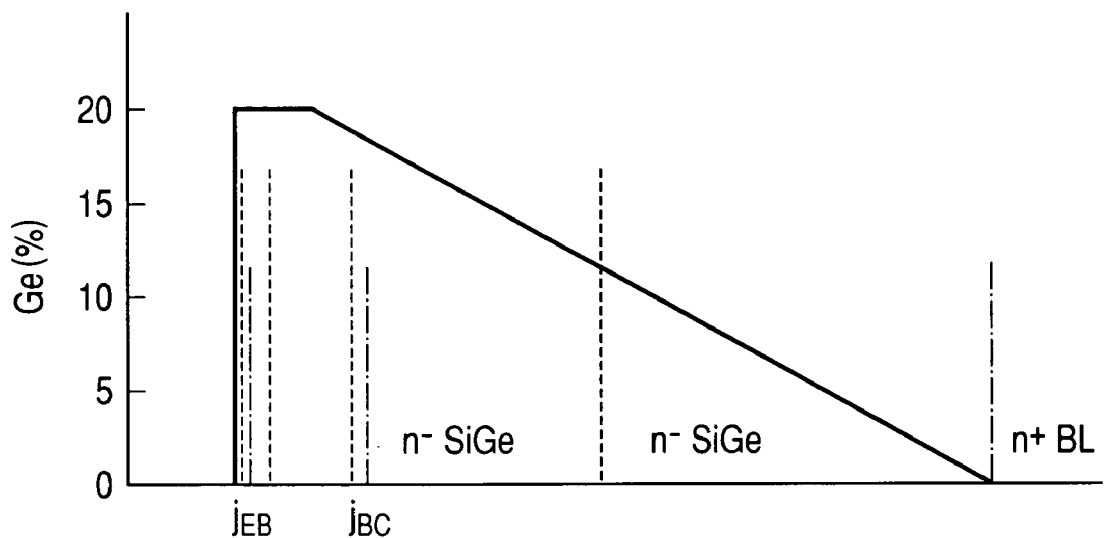
Figure 19B:
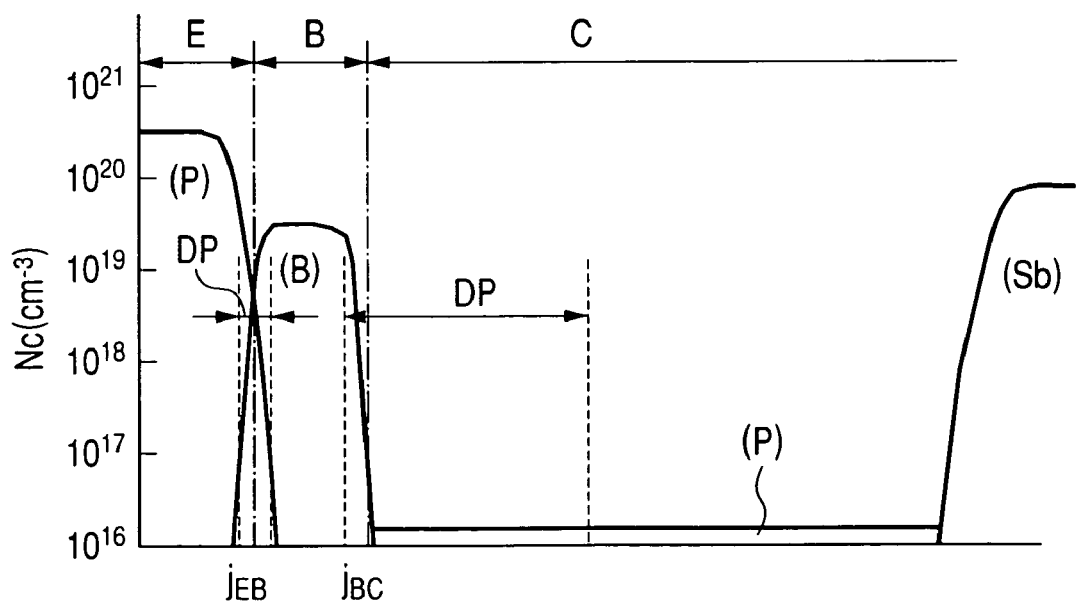

FIGS. 19A and 19B are diagrams showing the distributions of impurities and germanium in a main portion of SiGe HBT as a fifth example of the semiconductor device according to the invention. In this example, the first collector layer comprising the low concentration n-silicon layer is replaced with a low concentration n-single crystal silicon-germanium layer, to provide a profile of suppressing the hetero effect as much as possible near the base-collector junction.

During the transistor operation, the depletion layer edge in the collector is always present in the inside of the silicon-germanium layer and the generation of the energy barrier can be suppressed as far as higher current in this example. In the example shown in FIG. 19A, while the germanium composition is changed continuously from the interface between the low concentration n-silicon-germanium layer and the high concentration n-silicon buried layer to the inside of the intrinsic base, it is desirable that the composition distribution of germanium is controlled so as not to cause crystal defects while considering the amount of distortion caused by the total film thickness.

The germanium distribution in this example may have a region in which the composition increases from the vicinity of the emitter-base junction in the intrinsic base to the collector as shown in Example 2. Further, the p-impurity distribution in the base may be decreased in accordance with the germanium composition as shown Example 4.

In the examples described above, the n-impurity is distributed so as to have a peak in the n-silicon-germanium layer by disposing a region where the germanium composition decreases from the emitter side to the collector side in the intrinsic base and setting the germanium composition at the collector side depletion layer edge in the intrinsic base to lower than the peak value for the germanium composition in the intrinsic base. This can compensate accumulation of electrons also upon application of high current and the high withstanding voltage of the transistor can also be maintained by distributing the n-impurity restrictively thereby extending the collector-base depletion layer to the n-silicon layer. Transistor operation at high current in a hetero bipolar transistor having high withstanding voltage performance which was difficult so far is enabled and high performance and high withstanding voltage performance can be attained simultaneously.

Accordingly, a sufficient frequency region can be ensured, for example, in the high current operation of a bipolar transistor in hard disk reading/writing IC, and IC capable of sufficiently satisfying necessary standards can be attained.

Advantageous features of the semiconductor device according to the invention are summarized as below.

In the hetero bipolar transistor having the silicon-germanium layer, the base has a region in which the germanium composition always increases from the emitter side to the collector side in a portion of the intrinsic base at the inside thereof during transistor operation, and the germanium composition at the base-collector interface is lower than the maximum germanium composition in the base. This feature can decrease the height of the barrier in the conduction band generated upon increase of the collector current in the hetero bipolar transistor and enable favorable transistor operation at high current.

Further, in a region where the forbidden band width increase toward the collector in the inside of the base, the profile is preferably such that the impurity concentration in the base decrease toward the collector so as not to generate the barrier of the conduction body in the intrinsic base.

What is claimed is:

1. A semiconductor device comprising:
   a first conduction type first semiconductor layer buried in a semiconductor substrate;
   a first conduction type second semiconductor layer disposed above the first semiconductor layer;
   a first conduction type third semiconductor layer disposed above the second semiconductor layer and containing, at a portion thereof, a material having a smaller forbidden band width than that of the semiconductor substrate; and
   a second conduction type fourth semiconductor layer disposed above the third semiconductor layer and having a smaller forbidden band width than that of the semiconductor substrate, and a first conduction type fifth semiconductor layer disposed above the fourth semiconductor layer,
   wherein the fourth semiconductor layer has a region where:
   the forbidden band width increases stepwise or continuously toward the third semiconductor layer;
   the forbidden band width at the interface between the third semiconductor layer and the fourth semiconductor layer is larger than the smallest forbidden band width in the inside of the fourth semiconductor layer; and
   the forbidden band width is constant near the region where the forbidden band width is smallest in the inside of the fourth semiconductor layer.

2. The semiconductor device according to claim 1, wherein the forbidden band width in the inside of the third semiconductor layer increases stepwise or continuous to the second semiconductor layer.

3. The semiconductor device according to claim 1, wherein the second conduction type fourth semiconductor layer has an impurity in a concentration which decreases to the third semiconductor layer in a region where the forbidden band width increases to the third semiconductor layer in the inside of the fourth semiconductor layer.

4. The semiconductor device according to claim 1, wherein the second semiconductor layer is a first collector, the third semiconductor layer is a second collector, the fourth semiconductor layer is a base, and the fifth semiconductor layer is an emitter.

5. The semiconductor device according to claim 4, wherein the semiconductor substrate comprises silicon, wherein the first collector, the second collector, and the base each comprise single crystal silicon-germanium-carbon, and
wherein the emitter comprises single crystal silicon or single crystal silicon-germanium, or single crystal silicon-germanium-carbon.

6. The semiconductor device according to claim 5, wherein the intrinsic base region in the base has a region where:
the germanium composition always decreases stepwise or continuous to the second collector in the inside thereof during transistor operation; and
the germanium composition at the collector side depletion layer edge in the intrinsic base is smaller than the greatest germanium composition in the inside of the base.

7. The semiconductor device according to claim 6, wherein the germanium composition of the second collector decreases stepwise or continuously to the silicon substrate.

8. The semiconductor device according to claim 6, wherein the second conduction type fourth semiconductor layer has an impurity in a concentration which decreases to the second collector in a region where the germanium composition decreases to the second collector in the inside of the base.

9. A method of manufacturing a semiconductor device comprising steps of:
   forming a first conduction type first semiconductor layer above a semiconductor substrate;
   forming a first conduction type second semiconductor layer above the first semiconductor layer;
   forming a first conduction type third semiconductor layer containing, at a portion thereof, a material having a smaller forbidden band width than that of the semiconductor substrate above the second semiconductor layer and forming a second conduction type fourth semiconductor layer having a smaller forbidden band width than that of the semiconductor substrate above the third semiconductor layer; and
   forming a first conduction type fifth semiconductor layer above the fourth semiconductor layer,
   wherein the fourth semiconductor layer has a region where:
   the forbidden band width increases stepwise or continuously toward the third semiconductor layer;
   the forbidden band width at the interface between the third semiconductor layer and the fourth semiconductor layer is larger than the smallest forbidden band width in the inside of the fourth semiconductor layer; and the forbidden band width is constant near the region where the forbidden band width is smallest in the inside of the fourth semiconductor layer.

10. The method of manufacturing a semiconductor device according to claim 9, wherein the forbidden band width in the inside of the third semiconductor layer is formed so as to increase stepwise or continuously to the semiconductor substrate.

11. The method of manufacturing a semiconductor device according to claim 9, wherein the concentration of an impurity of the second conduction type fourth semiconductor layer is controlled so as to decrease to the third semiconductor layer in a region where the forbidden band width increases to the third semiconductor layer in the inside of the fourth semiconductor layer.

12. The method of manufacturing a semiconductor device according to claim 9, wherein the second semiconductor layer is a first collector, the third semiconductor layer is a second collector, the fourth semiconductor layer is a base, and the fifth semiconductor layer is an emitter.

13. The method of manufacturing a semiconductor device according to claim 12, wherein the semiconductor substrate comprises silicon, wherein the first collector, the second collector, and the base each comprise single crystal silicon-germanium-carbon, and wherein the emitter comprises single crystal silicon or single crystal silicon-germanium, or single crystal silicon-germanium-carbon.

14. The method of manufacturing a semiconductor device according to claim 13, wherein the base has a region where:

the germanium composition decreases stepwise or continuously to the second collector in the intrinsic base portion at the inside thereof during transistor operation; and the germanium composition at the collector side depletion layer edge in the intrinsic base region is smaller than the greatest germanium composition in the inside of the base.

15. The method of manufacturing a semiconductor device according to claim 14, wherein the germanium composition of the second collector is decreased stepwise or continuously to the silicon substrate.

16. The method of manufacturing a semiconductor device according to claim 14, wherein the concentration of an impurity of the second conduction type fourth semiconductor layer is decreased to the second collector in a region where the germanium composition decreases to the second collector in the inside of the base.

17. The method of manufacturing a semiconductor device according to claim 14, wherein the second collector, the base, and the emitter are formed by a gas phase growing method.

* * * * *